(12) United States Patent
Jeon et al.

(10) Patent No.: US 8,735,940 B2
(45) Date of Patent: May 27, 2014

(54) SEMICONDUCTOR DEVICE AND METHOD FOR MANUFACTURING THE SAME

(75) Inventors: Woo Chul Jeon, Suwon (KR); Ki Yeol Park, Suwon (KR); Young Hwan Park, Seoul (KR); Jung Hee Lee, Daegu (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 718 days.

(21) Appl. No.: 12/965,640

(22) Filed: Dec. 10, 2010

(65) Prior Publication Data

US 2011/0233613 A1 Sep. 29, 2011

(30) Foreign Application Priority Data

Mar. 25, 2010 (KR) .................. 10-2010-0026802

(51) Int. Cl.
*H01L 29/66* (2006.01)
(52) U.S. Cl.
USPC .............. 257/194; 257/190; 257/E29.246; 257/E21.403; 438/167; 438/172
(58) Field of Classification Search
USPC ............ 257/190, 194, E29.246, E21.403, 257/E21.407; 438/167, 172
See application file for complete search history.

(56) References Cited

U.S. PATENT DOCUMENTS

| 4,780,748 A | 10/1988 | Cunningham et al. |
| 7,038,253 B2 | 5/2006 | Yoshida et al. |
| 2011/0101370 A1* | 5/2011 | Cheng et al. .................... 257/76 |

FOREIGN PATENT DOCUMENTS

KR 10-2007-0024647 3/2007

* cited by examiner

*Primary Examiner* — Colleen Matthews
*Assistant Examiner* — Colleen E Snow
(74) *Attorney, Agent, or Firm* — McDermott Will & Emery LLP (57) ABSTRACT

There are provided a semiconductor device and a method for manufacturing the same. The semiconductor device according to the present invention includes a base substrate; a semiconductor layer that includes a receiving groove and a protrusion part formed on the base substrate, a first carrier injection layer and at least two insulating layers formed to traverse the first carrier injection layer formed in the semiconductor layer, and a second carrier injection layer spaced apart from the first carrier injection layer formed on the protrusion part; a source electrode and a drain electrode that are disposed to be spaced apart from each other on the semiconductor layer; and a gate electrode that is insulated from the source electrode and the drain electrode and has a recess part recessed into the receiving groove, wherein the lowest end portion of the receiving groove contacts the uppermost layer of the first carrier injection layer and the insulating pattern disposed at the innermost side of the semiconductor layer among the insulating patterns traverses the entire layer forming the first carrier injection layer and is disposed at the outer side of both side end portions in the thickness direction of the receiving groove.

30 Claims, 7 Drawing Sheets

SEMICONDUCTOR DEVICE AND METHOD FOR MANUFACTURING THE SAME

CROSS-REFERENCE TO RELATED APPLICATIONS

This application claims the priority of Korean Patent Application No. 10-2010-0026802 filed on Mar. 25, 2010, in the Korean Intellectual Property Office, the disclosure of which is incorporated herein by reference.

BACKGROUND OF THE INVENTION

1. Field of the Invention

The present invention relates to a semiconductor device, and more particularly, to a semiconductor device having a nitride-based semiconductor field effect transistor structure and a method for manufacturing the same.

2. Description of the Related Art

Generally, a group III-nitride-based semiconductor including group III elements such as gallium (Ga), aluminum (Al), indium (In), or the like, and nitrogen (N), has characteristics such as wide energy band gap, high electron mobility, saturation electron speed, and high thermochemical stability, and the like.

A nitride-based field effect transistor (N-FET) based on the group III-nitride-based semiconductor is manufactured using a semiconductor material having a wide energy band gap, for example, gallium nitride (GaN), aluminum gallium nitride (AlGaN), indium gallium nitride (InGaN), aluminum indium gallium nitride (AlINGaN), or the like.

The semiconductor device of the general nitride-based field effect transistor includes a base substrate, a nitride-based semiconductor layer formed on the base substrate, and a source electrode and a drain electrode formed on the semiconductor layer, and a gate electrode formed on the semiconductor layer between the source electrode and the drain electrode.

However, the field effect transistor using gallium nitride (GaN) is continually in a 'turned-on' state in which current flows due to low resistance between the drain electrode and the source electrode when gate voltage is OV (normal state), such that it consumes current and power. Therefore, in turning-off the field effect transistor, there is a disadvantage in that negative voltage should be applied to the gate electrode (normally-on structure).

SUMMARY OF THE INVENTION

An aspect of the present invention provides a semiconductor device with improved characteristics and a method for manufacturing the same.

An aspect of the present invention also provides a semiconductor device operable at high current and high output and a method for manufacturing the same.

According to an aspect of the present invention, there is provided a semiconductor device, including: a base substrate; a semiconductor layer that includes a receiving groove and a protrusion part formed on the base substrate, a first carrier injection layer and at least two insulating layers formed to traverse the first carrier injection layer formed in the semiconductor layer, and a second carrier injection layer spaced apart from the first carrier injection layer formed on the protrusion part; a source electrode and a drain electrode that are disposed to be spaced apart from each other on the semiconductor layer; and a gate electrode that is insulated from the source electrode and the drain electrode and has a recess part recessed into the receiving groove, wherein the lowest end portion of the receiving groove contacts the uppermost layer of the first carrier injection layer and the insulating pattern disposed at the innermost side of the semiconductor layer among the insulating patterns traverses the entire layer forming the first carrier injection layer and is disposed at the outer side of both side end portions in the thickness direction of the receiving groove.

Preferably, the lowest end portion of the receiving groove does not traverse the entire layer forming the first carrier injection layer.

The first carrier injection layer may be a high-concentration doping layer.

The high-concentration doping layer may be a delta doping layer.

The delta doping layer may be formed by being doped with at least any one selected from Si, Ge, and Sn.

The second carrier injection layer may be a high-concentration doping layer.

The high-concentration doping layer may be a delta doping layer.

The delta doping layer may be formed by being doped with at least any one selected from Si, Ge, and Sn.

The insulating pattern may be formed in plural in an amount of three or more.

The plurality of insulating patterns may be formed to be spaced apart from each other by a predetermined interval.

The lowest end portion and the side end portion of the receiving groove may be inclined to have an angle of 30° to 90°.

The semiconductor device may further include an oxide layer interposed between the receiving groove and the recess part.

The oxide layer may include a recess structure corresponding to the shape of the recess part.

The semiconductor device may further include a buffer layer between the base substrate and the semiconductor layer.

According to another aspect of the present invention, there is provided a method for manufacturing a semiconductor device, including: preparing a base substrate; forming a semiconductor layer that includes a receiving groove and a protrusion part formed on the base substrate, a first carrier injection layer and at least two insulating layers formed to traverse the first carrier injection layer formed in the semiconductor layer, and a second carrier injection layer spaced apart from the first carrier injection layer formed on the protrusion part; forming a source electrode and a drain electrode that are disposed to be spaced apart from each other on the semiconductor layer; and forming a gate electrode that is insulated from the source electrode and the drain electrode and has a recess part recessed into the receiving groove, wherein the lowest end portion of the receiving groove contacts the uppermost layer of the first carrier injection layer and the insulating pattern disposed at the innermost side of the semiconductor layer among the insulating patterns traverses the entire layer forming the first carrier injection layer and is formed to be disposed at the outer side of both side end portions in the thickness direction of the receiving groove.

The receiving groove may be formed so that the lowest end portion of the receiving groove does not traverse the entire layer forming the first carrier injection layer.

The first carrier injection layer may be a high-concentration doping layer.

The high-concentration doping layer may be a delta doping layer.

The delta doping layer may be formed by being doped with at least any one selected from Si, Ge, and Sn.

The second carrier injection layer may be a high-concentration doping layer.

The high-concentration doping layer may be a delta doping layer.

The delta doping layer may be formed by being doped with at least any one selected from Si, Ge, and Sn.

The second carrier injection layer may be a 2-dimensional electron gas layer.

The insulating pattern may be formed in plural in an amount of three or more.

The plurality of insulating patterns may be formed to be spaced apart from each other by a predetermined interval.

The receiving groove may be formed so that the lowest end portion and the side end portion of the receiving groove are inclined to have an angle of 30° to 90°.

The method for manufacturing a semiconductor device further includes forming an oxide layer interposed between the receiving groove and the recess part.

The oxide layer may be formed to have a recess structure corresponding to the shape of the recess part.

The method for manufacturing a semiconductor device may further include forming a buffer layer on the base substrate prior to the forming of the semiconductor layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EXEMPLARY EMBODIMENT

Various advantages and features of the present invention and methods thereof will become apparent from the following description of exemplary embodiments with reference to the accompanying drawings. However, the present invention may be modified in many different manners and should not be construed as being limited to the exemplary embodiments set forth herein. Rather, these exemplary embodiments may be provided so that this disclosure will be thorough and complete, and will fully convey the scope of the invention to those having skill in the art. Like reference numerals in the drawings denote like elements throughout the specification.

Terms used in the present specification are for explaining the exemplary embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Further, the exemplary embodiments described in the specification will be described with reference to cross-sectional views and/or plan views that are ideal exemplification figures. In the drawings, the thickness of layers and regions may be exaggerated for efficient description of technical contents and consequently, exemplified forms may be changed by manufacturing technologies and/or tolerances. Therefore, the exemplary embodiments of the present invention are not limited to specific forms but may include the change in forms generated according to the manufacturing processes. For example, an etching region vertically shown may be rounded or may have a predetermined curvature. Therefore, the regions shown in the drawings have schematic attributes and the shapes shown in the drawings show specific shapes of device regions by way of example only but are not limited to the scope of the present invention.

Hereinafter, a semiconductor device and a method for manufacturing the same according to exemplary embodiments of the present invention will be described with reference to the accompanying drawings.

Figure 1:
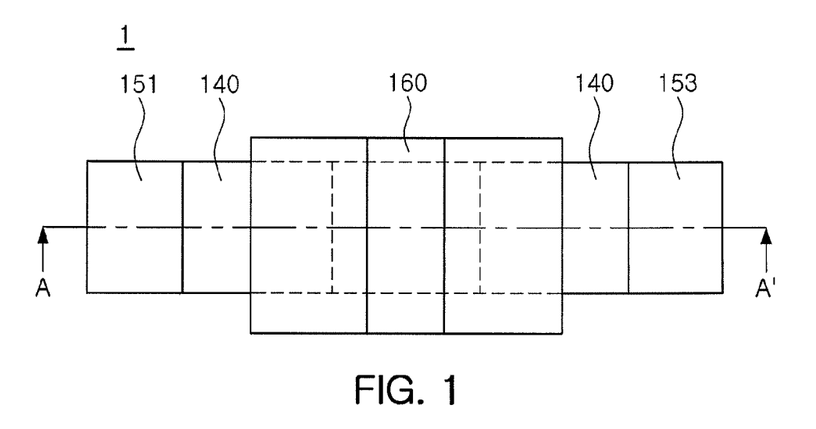
FIG. 1 is a plan view schematically showing a semiconductor device according to a first exemplary embodiment of the present invention.
Figure 2:
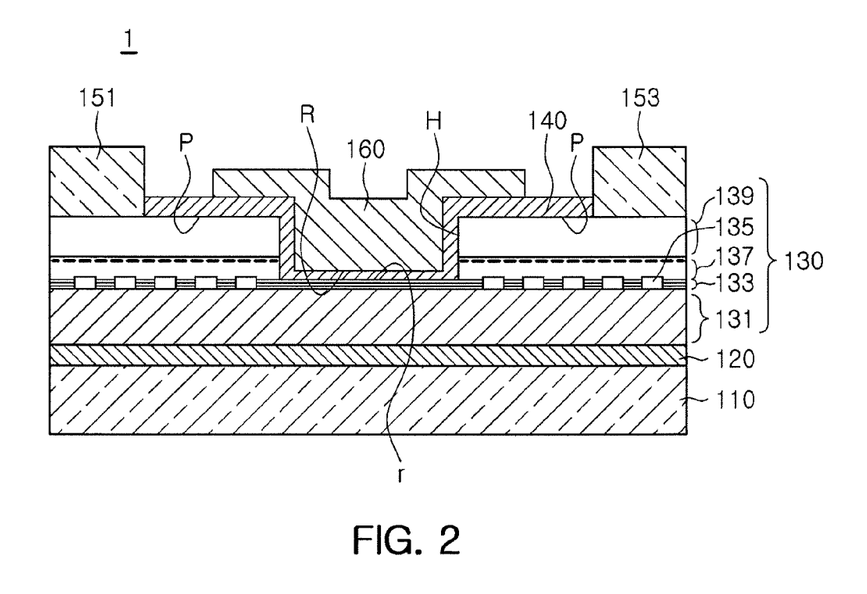
FIG. 2 is a cross-sectional view taken along line A-A' of FIG. 1.
Figure 3:
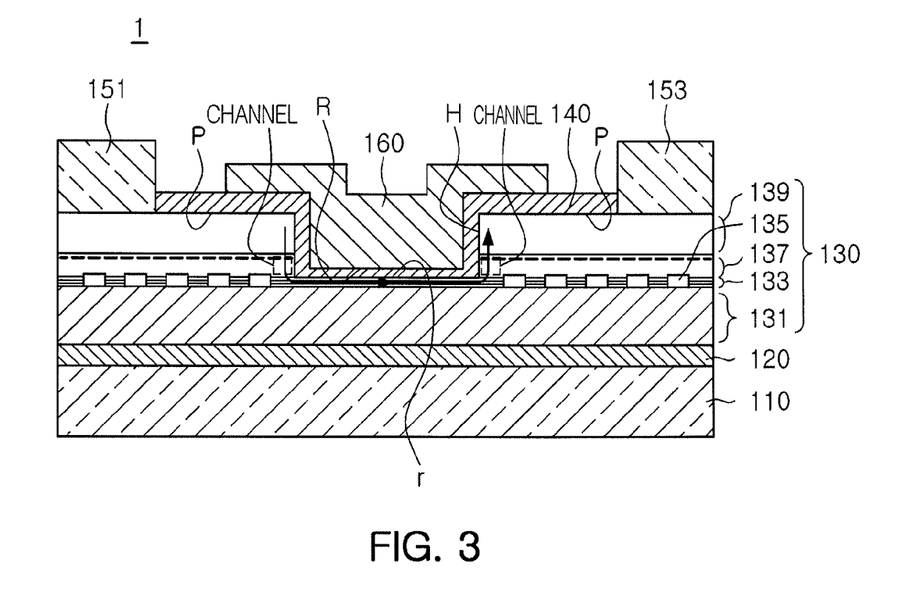
FIG. 3 is a schematic cross-sectional view demonstrating an operational principle of the semiconductor device according to the first exemplary embodiment of the present invention.

FIG. 1 is a plan view schematically showing a semiconductor device according to a first exemplary embodiment of the present invention, FIG. 2 is across-sectional view taken along line A-A' of FIG. 1, and FIG. 3 is a schematic cross-sectional view demonstrating an operational principle of the semiconductor device according to the first exemplary embodiment of the present invention.

Referring to FIGS. 1 and 2, a semiconductor device 1 according to an exemplary embodiment of the present invention may include a base substrate 110, a buffer layer 120, a semiconductor layer 130, a source electrode 151, a drain electrode 153, and a gate electrode 160.

The base substrate 110 may be a plate for forming a semiconductor device having a field effect transistor (FET) structure. For example, the base substrate 100 may be a semiconductor substrate. As an example, the base substrate 110 may be any one of a silicon substrate, a silicon carbide substrate, and a sapphire substrate; however, the base substrate 110 is not limited thereto.

Next, the buffer layer 120 may be disposed on the base substrate 110. As an example, the buffer layer 120 may be formed of an aluminum nitride (AlN) layer, however, the buffer layer 120 is not limited thereto. Herein, the buffer layer 120 may be provided to solve the problems caused due to a lattice mismatch between the base substrate 110 and a lower layer 131 of the semiconductor layer 130 to be subsequently formed.

The semiconductor layer 130 may be disposed on the buffer layer 120. As an example, the semiconductor layer 130 includes a receiving groove and a protrusion part P. Further, the semiconductor layer 130 includes a lower layer 131, a first carrier injection layer 133, at least two insulating patterns 135 formed to traverse the first carrier injection layer 133, an intermediate layer 137, and a second carrier injection layer 139 in the protrusion part P spaced apart from the delta doping layer 133, which are sequentially stacked therein.

The upper layer 139 may be made of a material having a lattice constant different from the lower layer 131 and the intermediate layer 137. For example, the lower layer 131, the intermediate layer 137, and the second carrier injection layer 139 may be a layer including group III-nitride-based materials. More specifically, the lower layer 131, the intermediate layer 137, and the second carrier injection layer 139 may be made of any one selected from gallium nitride (GaN), aluminum gallium nitride (AlGaN), indium gallium nitride (InGaN), and indium gallium nitride (InAlGaN). As an example, the lower layer 131 and the intermediate layer 137 may be gallium nitride layers and the second carrier injection layer 139 may be an aluminum gallium nitride layer.

In the semiconductor layer 130 having the above-mentioned structure, 2-dimensional electron gas (2DEG) may be generated at an interface between the intermediate layer 137 and the second carrier injection layer 139. When the semiconductor device 1 is operated, current may flow through the 2-dimensional electron gas (2DEG).

The first carrier injection layer 133 may be formed by alternately aligning a multi-layered gallium nitride layer (GaN) and the doping material in a thickness direction and is provided with the insulating pattern 135 to traverse the first carrier injection layer 133. At this time, the first carrier injection layer 133 may be formed by being doped with at least any one selected from Si, Ge, and Sn. Preferably, the first carrier injection layer is doped with Si. The doping elements of the first carrier injection layer 133 are not limited thereto. The present invention describes the high-concentration doping layer as the first carrier injection layer 133, in particular, the delta doping layer by way of example, but is not limited thereto. The first carrier injection layer 133 may be an $n^+$ doping layer.

The second carrier injection layer 139 may be provided on the intermediate layer 137. The second carrier injection layer 139 may be formed of the aluminum gallium nitride (AlGaN) layer. In this case, the 2-dimensional electron gas (2DEG) may be formed at the interface between the second carrier injection layer 139 made of the aluminum gallium nitride (AlGaN) layer and the intermediate 137 formed of the gallium nitride (GaN) layer.

Meanwhile, the receiving groove H may be included in the semiconductor layer 130. The receiving groove H may be formed through a predetermined photoresist process.

An oxide layer 140 may be provided on the receiving groove H. The oxide layer 140 is further formed through the predetermined photoresist process and includes a recess structure r corresponding to a shape of the receiving groove H. The oxide layer 140 may be a layer made of silicon dioxide ($SiO_2$). The exemplary embodiment may describe, by way of example, the case in which the oxide layer 140 is an oxide layer, but the oxide layer 140 may include a nitride layer.

Herein, the insulating pattern 135 among the insulating patterns 135 disposed on the innermost side of the semiconductor layer 130 is disposed to traverse the entire layer forming the first carrier injection layer 133. Preferably, the insulating pattern 135 is disposed at the outer side of both side end portions in the thickness direction of the receiving groove H. In addition, the lowest end portion of the receiving groove H contacts the uppermost layer of the first carrier injection layer 133 but is formed not to traverse the entire layer forming the first carrier injection layer 133.

A gate electrode 160 is provided on the oxide layer 140. The gate electrode 160 includes a recess part R received in a recess structure r of the oxide layer 140. The gate electrode 160 directly contacts the oxide layer 140, thereby making it possible to form a Schottky electrode.

The source electrode 151 and the drain electrode 153 may be disposed to be spaced apart from each other, having the gate electrode 160 therebetween. The source electrode 151 and the drain electrode 153 junction the second carrier injection layer 139 of the semiconductor layer 130, such that they may ohmic-contact the upper layer 139.

Meanwhile, the source electrode 151, the drain electrode 153, and the gate electrode 160 may be made of various materials. As an example, the source electrode 151 and the drain electrode 153 may be made of the same metal material and the gate electrode 160 may be made of a metal material different from the source electrode 151. In this case, the source electrode 151 and the drain electrode 153 are made of titanium (Ti), aluminum (Al), nickel (Ni), and gold (Au) from the lower portions thereof, wherein the titanium (Ti) and the aluminum (Al) of the lower portions thereof junction any one selected from gallium nitride (GaN), aluminum gallium nitride (AlGaN), indium gallium nitride (InGaN), and indium aluminum gallium nitride (InAlGaN) that form the lower layer 131, a mesa protrusion P, and a trench T, thereby making it possible to form the ohmic contact. The gate electrode 160 may be made of a metal material including metal elements different from at least any one of the above-mentioned metal elements. As another example, all of the source electrode 151, drain electrode 153, and gate electrode 160 may be made of the same metal material. To this end, the source electrode 151, the drain electrode 153, and the gate electrode 160 may simultaneously be formed by forming the same metal layer on the semiconductor layer 130 and then being subjected to the same photoresist etching process.

Referring to FIG. 3, the semiconductor device 1 provides the oxide layer 140 between the gate electrode 160 and the semiconductor layer 130 to form the normally-off state in which current does not flow through the 2-dimensional electron gas (2DEG) even though voltage is applied to the source electrode 151 and the drain electrode 153, when voltage is not applied to the gate electrode 160. Therefore, the semiconductor device 1 may have an field effect transistor (FET) structure capable of performing an enhancement mode operation, which prevents current from flowing when the gate voltage is 0 or negative (−).

In addition, the semiconductor device 1 forms the first carrier injection layer 133 as the high-concentration doping layer, i.e., the delta doping layer on the lower portion of the gate electrode 160, thereby making it possible to vertically form the channel while increasing the concentration of the channel. As described above, the channel is formed vertically and thus, the length of the channel may also be easily controlled. In addition, the insulating pattern 135 is formed in the first carrier injection layer 133, such that it can perform a control to prevent current from flowing to the outside of the channel, thereby making it possible to prevent a parasitic channel from being formed.

Generally, as in the exemplary embodiment of the present invention, in the case of the semiconductor device having a shape in which the gate electrode is recessed in the semiconductor layer, the length of the channel should be minimized to increase the current density. To this end, a need exists for a process of finely forming the gate electrode.

The present invention is to solve the above problem. As described above, the present invention forms the first carrier injection layer 133 as the high-concentration doping layer, i.e., the delta doping layer on the lower portion of the gate electrode 160 to vertically form the channel while increasing the concentration of the channel, thereby easily controlling the length of the channel. As a result, the present invention makes the manufacturing process easier than that of the related art. Further, the present invention can prevent the parasitic channel from being generated, thereby making it possible to more easily control the channel formation.

Hereinafter, a semiconductor device according to second to fourth exemplary embodiments of the present invention will be briefly described based on components different from the first exemplary embodiment with reference to FIGS. 4 through 6.

Figure 4:
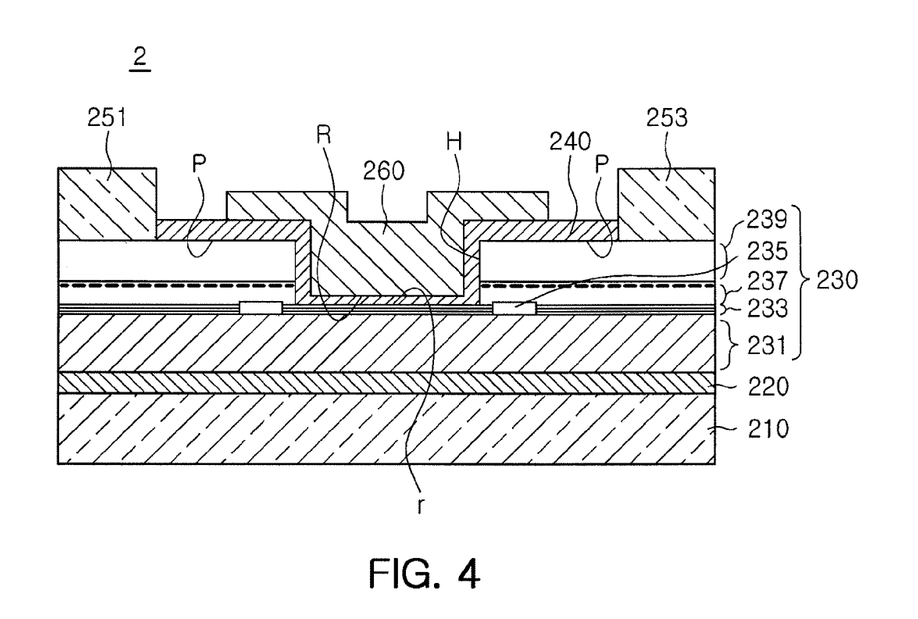
FIG. 4 is a plan view schematically showing a semiconductor device according to a second exemplary embodiment of the present invention.

Referring to FIG. 4, a semiconductor device 2 according to a second exemplary embodiment of the present invention has a difference in a structure of an insulating pattern 235 with respect to the semiconductor device 1 according to the first exemplary embodiment.

An insulating pattern 235 according to the second exemplary embodiment of the present invention is also disposed to traverse the entire layer forming a first carrier injection layer 233 and is disposed at the outer side of both side end portions in the thickness direction of the receiving groove H. However, only two insulating patterns 235 are provided at the outer sides of the both side end portions of the receiving groove H, which can prevent a parasitic channel from being generated. Meanwhile, the insulating pattern 235 may be formed to have a size larger than that of the insulating pattern 135 of the first exemplary embodiment. Although the number of insulating patterns 235 is formed at a minimum, the present invention can easily control the length of the channel by vertically forming the channel while increasing the concentration of the channel. Therefore, the present invention makes the manufacturing process easier than that of the related art. Further, the present invention can prevent a parasitic channel from being generated, thereby making it possible to more easily control the channel formation.

Figure 5:
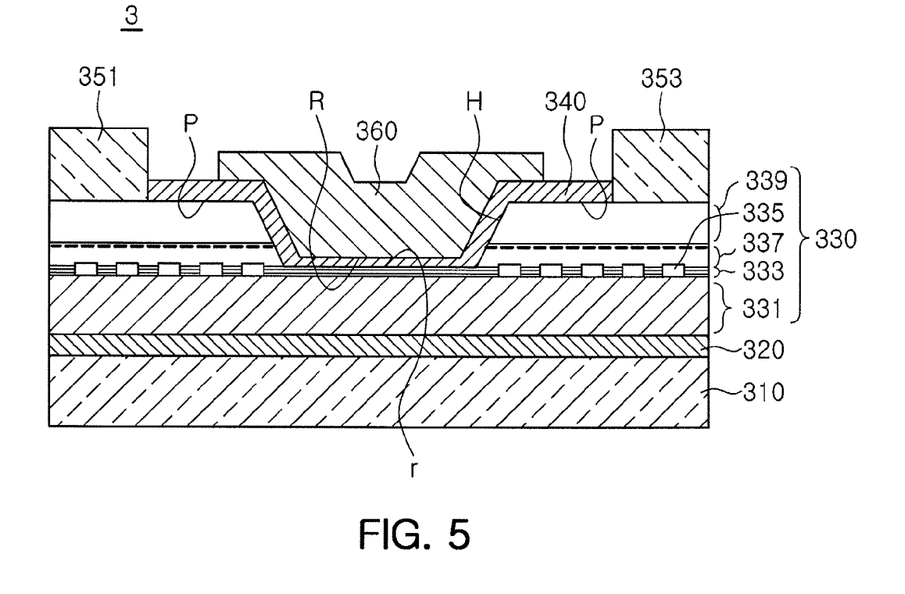
FIG. 5 is a plan view schematically showing a semiconductor device according to a third exemplary embodiment of the present invention.

Referring to FIG. 5, a semiconductor device 3 according to a third exemplary embodiment of the present invention has a difference in a structure of a gate electrode 260 with respect to the semiconductor device 1 according to the first exemplary embodiment.

A gate electrode 260 according to the third exemplary embodiment of the present invention is formed to have a slope of 30° to 90° so as to relatively lower electric field concentration at an edge portion of the gate electrode 260, unlike the gate electrode 160 having the vertical structure, according to the first exemplary embodiment. As described above, the third exemplary embodiment of the present invention can relatively lower the electric field concentration at the edge portion of the gate electrode 260 by forming the gate electrode to have the slope, thereby making it possible to increase breakdown voltage. In addition, the third exemplary embodiment of the present invention forms the channel vertically while increasing the concentration thereof, thereby making it possible to easily control the length of the channel. Therefore, the manufacturing process is easier than that of the related art. Further, the present invention can prevent a parasitic channel from being generated, thereby making it possible to more easily control the channel formation.

Figure 6:
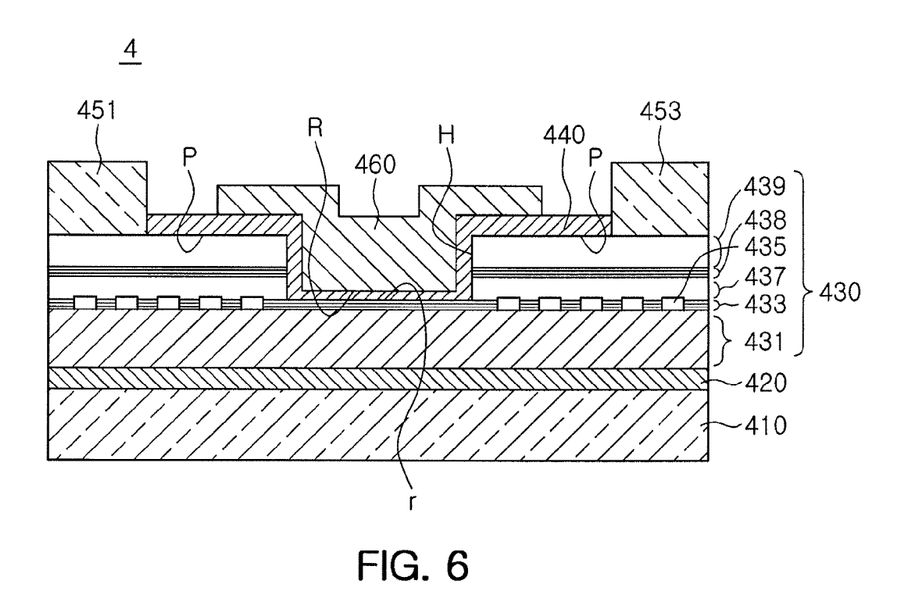
FIG. 6 is a cross-sectional view schematically showing a semiconductor device according to a fourth exemplary embodiment of the present invention.

Referring to FIG. 6, a semiconductor device 4 according to a fourth exemplary embodiment of the present invention has a difference in a structure of a second carrier injection layer 439 with respect to the semiconductor device 1 according to the first exemplary embodiment.

The second carrier injection layer 439 according to the fourth exemplary embodiment of the present invention does not include the second electron gas (2DEG) at the interface between the second carrier injection layer 139 formed of aluminum gallium nitride (AlGaN) and the intermediate layer 137 formed of gallium nitride (GaN), but includes another delta doping layer 438. As described above, even when the fourth exemplary embodiment of the present invention uses the delta doping layer 438 instead of the 2-dimensional electron gas 2DEG according to the first exemplary embodiment, it can easily control the length of the channel by vertically forming the channel while increasing the concentration of the channel. Therefore, the manufacturing process is easier than that of the related art. Further, the present invention can prevent a parasitic channel from being generated, thereby making it possible to more easily control channel formation.

A method for manufacturing a semiconductor device according to an exemplary embodiment of the present invention will hereinafter be described with reference to FIGS. 2, 6, 7A through 8D. Repeated descriptions of the semiconductor device according to the exemplary embodiment of the present invention will be omitted and simplified.

FIGS. 7A through 7D are schematic cross-sectional views showing a method for manufacturing the semiconductor device according to a first exemplary embodiment of the present invention, and FIGS. 8A through 8D are cross-sectional views schematically showing a method for manufacturing the semiconductor device according to a fourth exemplary embodiment of the present invention.

Figure 7A:
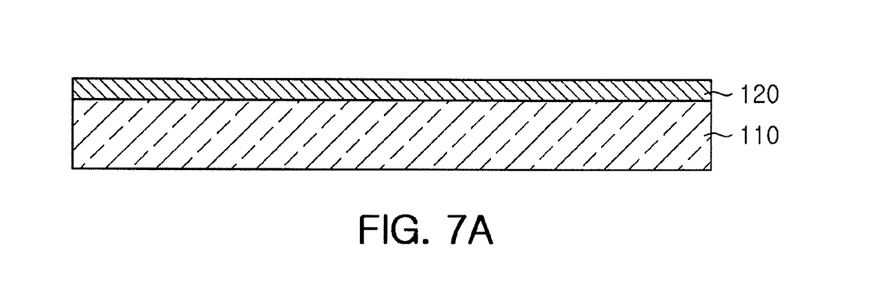
FIGS. 7A through 7D are schematic cross-sectional views schematically showing a method for manufacturing the semiconductor device according to a first exemplary embodiment of the present invention.

As shown in FIG. 7A, a base substrate 110 is prepared. As the base substrate 110, a semiconductor substrate may be used. For example, the semiconductor substrate 110 may be any one of a silicon substrate, a silicon carbide substrate, and a sapphire substrate but the base substrate 110 is not limited thereto.

Then, a buffer layer 120 may be formed on the base substrate 110. Herein, the buffer layer 120 may be formed of the aluminum nitride (AlN) layer but the buffer layer 120 is not limited thereto. Herein, the buffer layer 120 may be provided to solve the problems caused due to a lattice mismatch between the base substrate 110 and a lower layer 131 of the semiconductor layer 130 to be formed later.

Next, a process of forming the semiconductor layer 130 according to the first exemplary embodiment of the present invention shown in FIG. 2 will be described below.

Figure 7B:
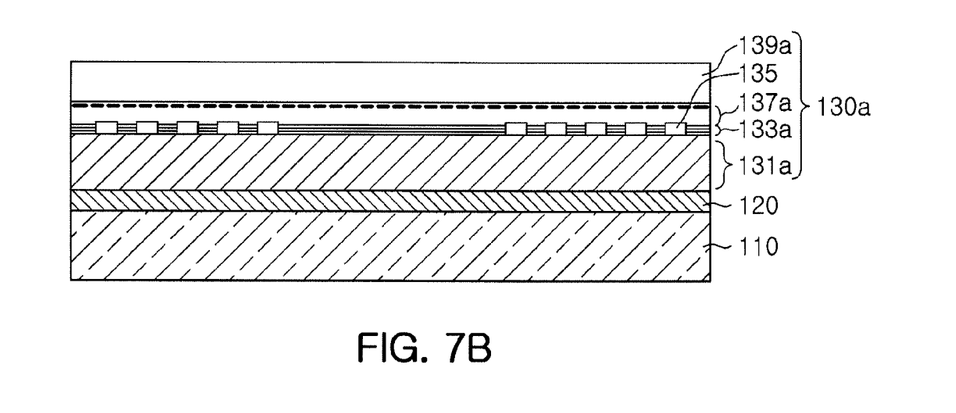

First, as shown in FIG. 7B, a lower layer 131a is epitaxially grown by using the buffer layer 120 as a seed layer. Next, after an insulating layer (not shown) that may be made of $SiO_2$ is formed on the buffer layer 120 and the photoresist pattern (not shown) is formed, the plurality of insulating patterns 135 are formed by etching the insulating layer using the photoresist pattern as an etch mask. Then, after a first carrier injection layer 133a is grown on the insulating pattern 135, an intermediate layer 137a is epitaxially grown on the first carrier injection layer 133a.

The first carrier injection layer 133a may be formed by alternately aligning a multi-layered gallium nitride (GaN) layer and the doping material in a thickness direction and is provided with the insulating pattern 135 to traverse the first carrier injection layer 133a. At this time, the first carrier injection layer 133a may be formed by being doped with at least any one selected from Si, Ge, and Sn. Preferably, the first carrier injection layer is doped with Si. The doping elements of the first carrier injection layer 133a are not limited thereto. The present invention describes the high-concentration doping layer as the first carrier injection layer 133a, in particular, the delta doping layer by way of example, but is not limited thereto. The first carrier injection layer 133a may be an $n^+$ doping layer.

In the first carrier injection layer 133a doped with Si as an example, the base substrate 110 formed from the lower layer 131a on which the first carrier injection layer 133a will be formed to the insulating pattern 135 is first disposed inside a reaction tube maintained at a low-pressure hydrogen atmosphere and the gallium nitride (GaN) layer is grown and then, the growth of the gallium nitride (GaN) layer is stopped for a predetermined period of time. Thereafter, silane ($SiH_4$) gas is introduced into the reaction tube for a predetermined period of time together with hydrogen gas and ammonium gas to form the first carrier injection layer 133*a* made of Si on the gallium nitride (GaN) layer and the insulating pattern 135. The first carrier injection layer 133*a* may have a desired number of layers formed by repeating the above-mentioned process.

At this time, the insulating pattern 135 may be formed in plural in an amount of two or more. It is preferable that the plurality of insulating patterns 135 be formed to be spaced apart by a predetermined interval.

In this configuration, the lower layer 131*a* and the intermediate layer 137*a* may be formed of the high-resistance gallium nitride (GaN) layer.

As the epitaxial growth process for forming the high-resistance gallium nitride (GaN) layer, at least any one of a molecular beam epitaxial growth process, an atomic layer epitaxial growth process, a flow modulation organometallic vapor phase epitaxial growth process, an organometallic vapor phase epitaxial growth process, and a hybrid vapor phase epitaxial growth process may be used. As another example, as a process for forming the gallium nitride (GaN) layer, any one of a chemical vapor deposition process and a physical vapor deposition process may be used.

Next, the second carrier injection layer 139*a* is grown on the intermediate layer 137*a*. Herein, the second carrier injection layer 139 may be formed of the aluminum gallium nitride (AlGaN) layer.

In this case, the 2-dimensional electron gas (2DEG) may be formed at the interface between the aluminum gallium nitride (AlGaN) layer and the gallium nitride (GaN) layer.

Figure 7C:
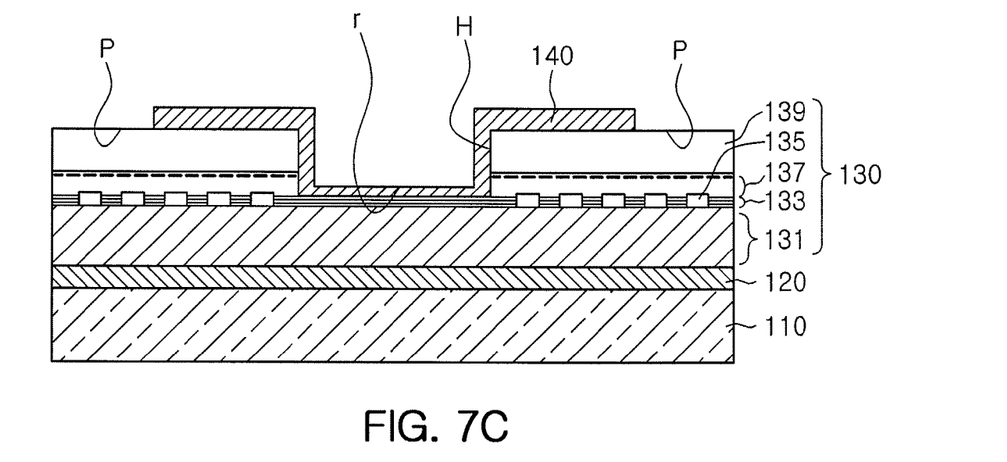

As shown in FIG. 7C, after the photoresist pattern (not shown) is formed on the semiconductor layer 130*a* in the previous process, the semiconductor layer 130*a* is etched through the predetermined photoresist process, thereby forming the semiconductor layer 130 including the receiving groove H and the protrusion part P.

Next, the oxide layer 140 may be formed on the semiconductor layer 130. As an example, the oxide layer 140 may be a silicon oxide layer $SiO_2$. The photoresist pattern (not shown) is formed on the oxide layer 140 and then, is recessed into the receiving groove H through the predetermined photoresist process, thereby completing the oxide layer 140 including the recess structure r. The exemplary embodiment may describe, by way of example, the case in which the oxide layer 140 is an oxide layer; however, the oxide layer 140 may also include a nitride layer.

Herein, it is preferable that the lowest end portion of the receiving groove H contacts the uppermost layer of the first carrier injection layer 133 but is formed not to traverse the entire layer forming the first carrier injection layer 133.

Further, the insulating pattern 135 disposed on the innermost side of the semiconductor layer 130 is disposed to traverse the entire layer forming the first carrier injection layer 133. Preferably, the insulating pattern 135 is disposed at the outer side of both side ends in the thickness direction of the receiving groove H.

Figure 7D:
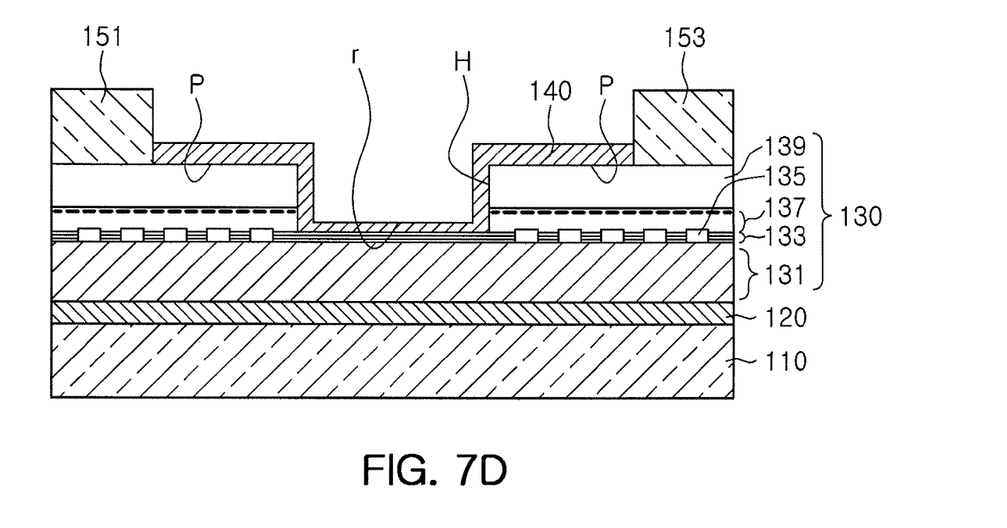

Next, as shown in FIG. 7D, the source electrode 151 and the drain electrode 153 may be formed on the semiconductor layer 130. After the first metal layer is formed on the protrusion part P of the semiconductor layer 130, the source electrode 151 and the drain electrode 153 disposed to be spaced apart from each other may be formed through the predetermined photoresist process. As the first metal layer, a metal layer made of titanium (Ti), aluminum (Al), nickel (Ni), and gold (Au) from the lower portion may be used.

Thereafter, the semiconductor device 1 according to the first exemplary embodiment of the present invention shown in FIG. 3 may be completed by forming the gate electrode 160 including the recess part R formed on the oxide layer 140. After the second metal layer made of a material different from the first metal layer is formed on the oxide layer 140, the gate electrode 160 is formed by performing the predetermined photoresist process.

In FIGS. 8A through 8D, the only difference between the method for manufacturing the semiconductor device according to the fourth exemplary embodiment of the present invention and the method for manufacturing the semiconductor device according to the first exemplary embodiment is in the structure of the second carrier injection layer 439.

Figure 8A:
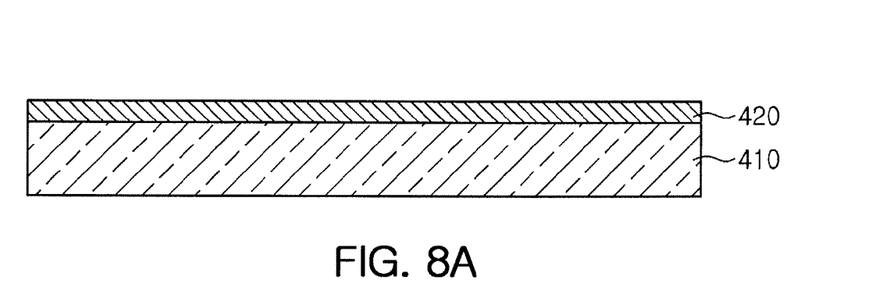
FIGS. 8A through 8D are cross-sectional views schematically showing a method for manufacturing the semiconductor device according to a fourth exemplary embodiment of the present invention.

As shown in FIG. 8A, a base substrate 410 is prepared. As the base substrate 410, a semiconductor substrate may be used. For example, the semiconductor substrate 410 may be any one of a silicon substrate, a silicon carbide substrate, and a sapphire substrate; however, the base substrate 410 is not limited thereto.

Then, a buffer layer 420 may be formed on the base substrate 410. The buffer layer 420 may be formed of aluminum nitride (AlN), however, the buffer layer 420 is not limited thereto. Herein, the buffer layer 420 may be provided to solve the problems caused due to a lattice mismatch between the base substrate 410 and a lower layer 430 of the semiconductor layer 431 to be subsequently formed.

Next, a process of forming the semiconductor layer 430 according to the fourth exemplary embodiment of the present invention shown in FIG. 6 will be described below.

Figure 8B:
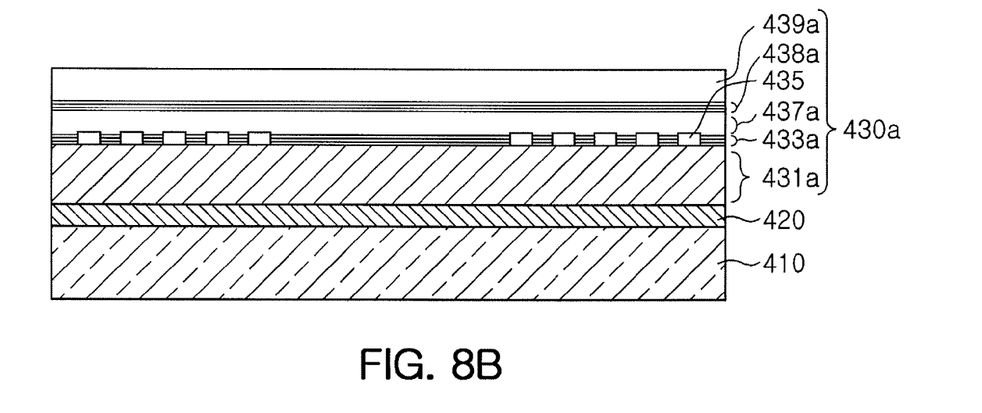

First, as shown in FIG. 8B, a lower layer 431*a* is epitaxially grown by using the buffer layer 420 as a seed layer. Next, after an insulating layer (not shown) that may be made of $SiO_2$ is formed on the buffer layer 420 and the photoresist pattern (not shown) is formed, the plurality of insulating patterns 435 are formed by etching the insulating layer using the photoresist pattern as an etch mask. Then, after a first carrier injection layer 433*a* is grown on the insulating pattern 435 and then, an intermediate layer 437*a* is epitaxially grown on the first carrier injection layer 433*a*.

The first carrier injection layer 433*a* may be formed by alternately aligning a multi-layered gallium nitride (GaN) layer and the doping material in a thickness direction and is provided with the insulating pattern 435 to traverse the first carrier injection layer 433*a*. At this time, the first carrier injection layer 433*a* may be formed by being doped with at least any one selected from Si, Ge, and Sn. Preferably, the first carrier injection layer is doped with Si. The doping elements of the first carrier injection layer 433*a* are not limited thereto. The present invention describes the high-concentration doping layer as the first carrier injection layer 433*a*, in particular, the delta doping layer by way of example, but is not limited thereto. The first carrier injection layer 433*a* may be an $n^+$ doping layer.

In the first carrier injection layer 433*a* doped with Si as an example, the base substrate 410 formed from the lower layer 431*a* on which the first carrier injection layer 433*a* is formed to the insulating pattern 435 is first disposed inside a reaction tube maintained at a low-pressure hydrogen atmosphere and the gallium nitride (GaN) layer is grown, and then, the growth of the gallium nitride (GaN) layer stops for a predetermined time. Thereafter, silane ($SiH_4$) gas is introduced into the reaction tube for a predetermined time together with hydrogen gas and ammonium gas to form the first carrier injection layer 433a made of Si on the gallium nitride (GaN) layer and the insulating pattern 435. The desired number of first carrier injection layers 433a may be formed by repeating the above-mentioned process.

At this time, the insulating pattern 435 may be formed in plural in an amount of two or more. It is preferable that the plurality of insulating patterns 435 are formed to be spaced apart by a predetermined interval.

In this configuration, the lower layer 431a and the intermediate layer 437a may be formed the high-resistance gallium nitride (GaN) layer.

As the epitaxial growth process for forming the high-resistance gallium nitride (GaN) layer, at least any one of a molecular beam epitaxial growth process, an atomic layer epitaxial growth process, a flow modulation organometallic vapor phase epitaxial growth process, an organometallic vapor phase epitaxial growth process, and a hybrid vapor phase epitaxial growth process may be used. As another example, as a process for forming the gallium nitride (GaN) layer, any one of a chemical vapor deposition process and a physical vapor deposition process may be used.

Next, another delta doping layer 438a, as the high-concentration doping layer, is grown on the intermediate layer 437a to be spaced apart from the delta doping layer 433a. Then, the second carrier injection layer 439a formed of an $n^+$ gallium nitride ($n^+$-GaN) layer is grown on the delta doping layer 438a.

In this case, the 2-dimensional electron gas 2DEG is not formed at the interface between the high-concentration doping layer formed of the delta doping layer 438a and the gallium nitride (GaN) layer, unlike the first exemplary embodiment.

In this configuration, the high-concentration doping layer formed of the delta doping layer 438a may be formed by alternately aligning the multi-layered gallium nitride (GaN) layer and the doping material in a thickness direction.

The delta doping layers 433a and 438a may be formed by being doped with at least any one selected from Si, Ge, and Sn. Preferably, the first carrier injection layer is doped with Si. The doping elements of the delta doping layers 433a and 438a are not limited thereto.

In the delta doping layer 438a doped with Si as an example, the gallium nitride (GaN) layer is grown on the intermediate layer 437a, on which the delta doping layer 438a will be formed, inside a reaction tube maintained at a low-pressure hydrogen atmosphere, and then, the growth of the gallium nitride (GaN) layer is stopped for a predetermined time. Then, silane ($SiH_4$) gas is introduced into the reaction tube for a predetermined time together with hydrogen gas and ammonium gas to form the gallium nitride (GaN) layer and the delta doping layer. The desired number of delta doping layers 438a may be formed by repeating the above-mentioned process.

Figure 8C:
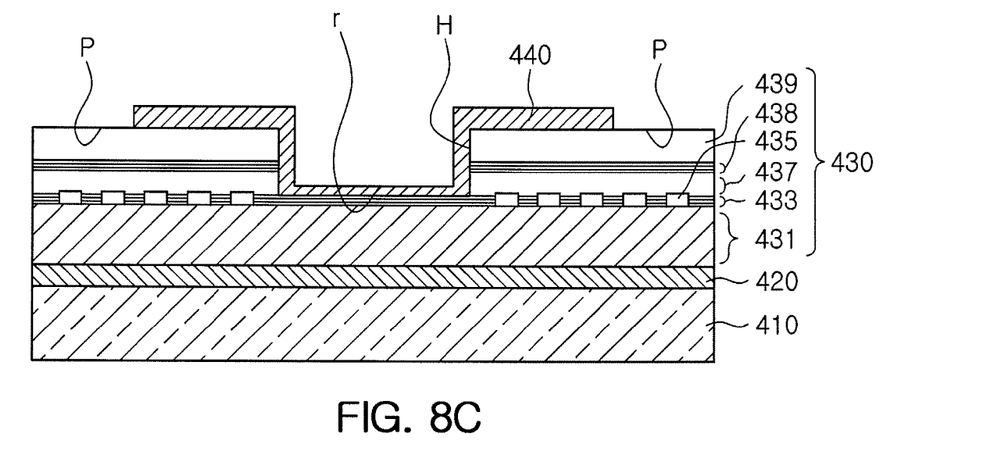

As shown in FIG. 8C, after the photoresist pattern (not shown) is formed on the semiconductor layer 430a in the previous process, the semiconductor layer 430a is etched by using the photoresist pattern as an etch mask, thereby forming the semiconductor layer 430 including the receiving groove H and the protrusion part P.

Next, the oxide layer 440 may be formed on the semiconductor layer 430. As an example, the oxide layer 440 may be a silicon oxide layer $SiO_2$. The photoresist pattern (not shown) is formed on the oxide layer 440 and then, is recessed into the receiving groove H through the predetermined photoresist process, thereby completing the oxide layer 440 including the recess structure. The exemplary embodiment may describe, by way of example, the case in which the oxide layer 440 is an oxide layer; however, the oxide layer 440 may include a nitride layer.

In this configuration, it is preferable that the lowest end portion of the receiving groove H contacts the uppermost layer of the first carrier injection layer 433 yet is formed so as not to traverse the entire layer forming the first carrier injection layer 433.

Further, the insulating pattern 435 disposed on the innermost side of the semiconductor layer 430 is disposed so as to traverse the entire layer forming the first carrier injection layer 433. Preferably, the insulating pattern 435 is disposed at the outer side of both side end portions in the thickness direction of the receiving groove H.

Figure 8D:
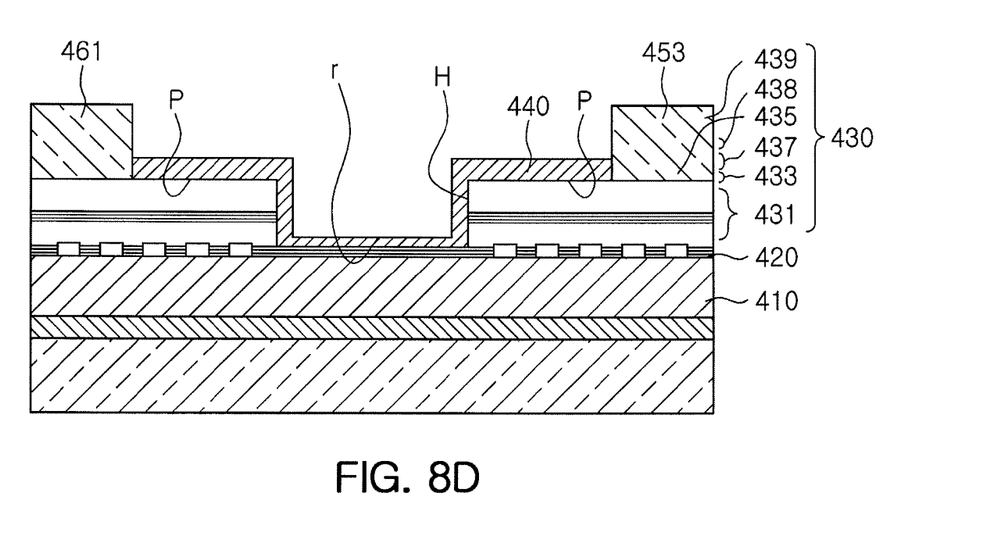

Next, as shown in FIG. 8D, the source electrode 451 and the drain electrode 453 may be formed on the semiconductor layer 430. After the first metal layer is formed on the protrusion part P of the semiconductor layer 430, the source electrode 451 and the drain electrode 453 disposed to be spaced apart from each other may be formed through the predetermined photoresist process. As the first metal layer, a metal layer made of titanium (Ti), aluminum (Al), nickel (Ni), and gold (Au) from the lower portion may be used.

Thereafter, the semiconductor device 4 according to the fourth exemplary embodiment of the present invention shown in FIG. 6 may be completed by forming the gate electrode 460 including the recess part R on the oxide layer 440. After the second metal layer made of a material different from the first metal layer is formed on the oxide layer 440, the gate electrode 460 is formed by performing the predetermined photoresist process.

As set forth above, the semiconductor device according to the present invention can provide the semiconductor device having the field effect transistor (FET) structure with improved characteristics and a method of manufacturing the same.

Further, the present invention forms the delta doping layer as the carrier injection layer on the lower portion of the gate electrode having the recess structure to vertically form the channel while increasing the concentration of the channel so that the length of the channel can be easily controlled, it can make the manufacturing process easier than the related art and provide the semiconductor device having the field effect transistor (FET) structure operable at high current and high output and the method for manufacturing the same.

In addition, the present invention forms the insulating pattern in the carrier injection layer on the lower portion of the gate electrode having the recession structure to prevent a parasitic channel from being generated, thereby making it possible to more easily control the channel formation.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed exemplary embodiments. It is to be understood that other exemplary embodiments are also included within scope of the appended claims.

What is claimed is:

1. A semiconductor device, comprising:
a base substrate;
a semiconductor layer that includes a receiving groove and a protrusion part formed on the base substrate, a first carrier injection layer and at least two insulating patterns formed to traverse the first carrier injection layer formed in the semiconductor layer, and a second carrier injection layer spaced apart from the first carrier injection layer formed on the protrusion part;
a source electrode and a drain electrode that are disposed to be spaced apart from each other on the semiconductor layer; and
a gate electrode that is insulated from the source electrode and the drain electrode and has a recess part recessed into the receiving groove,
wherein the lowest end portion of the receiving groove contacts the uppermost layer of the first carrier injection layer and the insulating pattern disposed at the innermost side of the semiconductor layer among the insulating patterns traverses the entire layer forming the first carrier injection layer and is disposed at the outer side of both side end portions in the thickness direction of the receiving groove.

2. The semiconductor device of claim 1, wherein the lowest end portion of the receiving groove does not traverse the entire layer forming the first carrier injection layer.

3. The semiconductor device of claim 1, wherein the first carrier injection layer is a high-concentration doping layer.

4. The semiconductor device of claim 3, wherein the high-concentration doping layer is a delta doping layer.

5. The semiconductor device of claim 4, wherein the delta doping layer is formed by being doped with at least any one selected from Si, Ge, and Sn.

6. The semiconductor device of claim 3, wherein the second carrier injection layer is a high-concentration doping layer.

7. The semiconductor device of claim 6, wherein the high-concentration doping layer is a delta doping layer.

8. The semiconductor device of claim 7, wherein the delta doping layer is formed by being doped with at least any one selected from Si, Ge, and Sn.

9. The semiconductor device of claim 3, wherein the second carrier injection layer is a 2-dimensional electron gas layer.

10. The semiconductor device of claim 1, wherein the insulating pattern is formed in plural in an amount of three or more.

11. The semiconductor device of claim 1, wherein the plurality of insulating patterns are formed to be spaced apart from each other by a predetermined interval.

12. The semiconductor device of claim 1, wherein the lowest end portion and the side end portion of the receiving groove are inclined to have an angle of 30° to 90°.

13. The semiconductor device of claim 1, further comprising an oxide layer interposed between the receiving groove and the recess part.

14. The semiconductor device of claim 13, wherein the oxide layer includes a recess structure corresponding to the shape of the recess part.

15. The semiconductor device of claim 1, further comprising a buffer layer between the base substrate and the semiconductor layer.

16. A method for manufacturing a semiconductor device, comprising:
preparing a base substrate;
forming a semiconductor layer that includes a receiving groove and a protrusion part formed on the base substrate, a first carrier injection layer and at least two insulating patterns formed to traverse the first carrier injection layer formed in the semiconductor layer, and a second carrier injection layer spaced apart from the first carrier injection layer formed on the protrusion part;
forming a source electrode and a drain electrode that are disposed to be spaced apart from each other on the semiconductor layer; and
forming a gate electrode that is insulated from the source electrode and the drain electrode and has a recess part recessed into the receiving groove,
wherein the lowest end portion of the receiving groove contacts the uppermost layer of the first carrier injection layer and the insulating pattern disposed at the innermost side of the semiconductor layer among the insulating patterns traverses the entire layer forming the first carrier injection layer and is formed to be disposed at the outer side of both side end portions in the thickness direction of the receiving groove.

17. The method for manufacturing a semiconductor device of claim 16, wherein the receiving groove is formed so that the lowest end portion of the receiving groove does not traverse the entire layer forming the first carrier injection layer.

18. The method for manufacturing a semiconductor device of claim 16, wherein the first carrier injection layer is a high-concentration doping layer.

19. The method for manufacturing a semiconductor device of claim 18, wherein the high-concentration doping layer is a delta doping layer.

20. The method for manufacturing a semiconductor device of claim 19, wherein the delta doping layer is formed by being doped with at least any one selected from Si, Ge, and Sn.

21. The method for manufacturing a semiconductor device of claim 18, wherein the second carrier injection layer is a high-concentration doping layer.

22. The method for manufacturing a semiconductor device of claim 21, wherein the high-concentration doping layer is a delta doping layer.

23. The method for manufacturing a semiconductor device of claim 22, wherein the delta doping layer is formed by being doped with at least any one selected from Si, Ge, and Sn.

24. The method for manufacturing a semiconductor device of claim 18, wherein the second carrier injection layer is a 2-dimensional electron gas layer.

25. The method for manufacturing a semiconductor device of claim 16, wherein the insulating pattern is formed in plural in an amount of three or more.

26. The method for manufacturing a semiconductor device of claim 16, wherein the plurality of insulating patterns are formed to be spaced apart from each other by a predetermined interval.

27. The method for manufacturing a semiconductor device of claim 16, wherein the receiving groove is formed so that the lowest end portion and the side end portion of the receiving groove are inclined to have an angle of 30° to 90°.

28. The method for manufacturing a semiconductor device of claim 16, further comprising forming an oxide layer interposed between the receiving groove and the recess part.

29. The method for manufacturing a semiconductor device of claim 28, wherein the oxide layer is formed to have a recess structure corresponding to the shape of the recess part.

30. The method for manufacturing a semiconductor device of claim 16, further comprising forming a buffer layer on the base substrate prior to the forming of the semiconductor layer.

* * * * *